United States Patent
Vimercati et al.

(10) Patent No.: US 7,321,512 B2
(45) Date of Patent: Jan. 22, 2008

(54) RAMP GENERATOR AND RELATIVE ROW DECODER FOR FLASH MEMORY DEVICE

(75) Inventors: Daniele Vimercati, Carate Brianza (IT); Marco Onorato, Concorezzo (IT); Carmela Albano, Sant'Agata li Battiati (IT); Mounia El-Moutaouakil, Andalo Valtellino (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 63 days.

(21) Appl. No.: 11/381,426

(22) Filed: May 3, 2006

(65) Prior Publication Data

US 2006/0250852 A1    Nov. 9, 2006

(30) Foreign Application Priority Data

May 3, 2005    (IT) ..................... VA2005A0028

(51) Int. Cl.
    *G11C 11/34*    (2006.01)
(52) U.S. Cl. .............................. 365/185.19; 365/185.21
(58) Field of Classification Search ..................... None
    See application file for complete search history.

(56) References Cited

U.S. PATENT DOCUMENTS 5,638,320 A * 6/1997 Wong et al. .......... 365/185.03

* cited by examiner

*Primary Examiner*—Huan Hoang
*Assistant Examiner*—Jason Lappas
(74) *Attorney, Agent, or Firm*—Lisa K. Jorgenson; Allen, Dyer, Doppelt, Milbrath & Gilchrist, P.A.

(57) ABSTRACT

A non-volatile memory device includes an array of memory cells organized into a plurality of array sectors, with each array sector being singularly addressable through an array wordline. An array of reference cells is addressable through a reference wordline. A respective voltage ramp generator is provided for each array sector for generating a voltage ramp on an array wordline for reading a memory cell therein, and is provided for each array of reference cells for generating a voltage ramp on a reference wordline for a reference cell therein. A respective row decoding circuit is coupled between each respective voltage ramp generator and corresponding reference wordline or array wordline. A current generator generates a current to be injected on a circuit node in a selected array sector and on a circuit node of the array of reference cells to produce on the circuit nodes a voltage ramp similar to the generated voltage ramp. A respective local ramp generating circuit is provided for each array sector and for the array of reference cells, and delivering a charge current based upon a capacitance of the circuit nodes of the corresponding addressed array wordline or reference wordline, towards the respective row decoder of the wordline.

20 Claims, 5 Drawing Sheets

RAMP GENERATOR AND RELATIVE ROW DECODER FOR FLASH MEMORY DEVICE

FIELD OF THE INVENTION

The invention relates in general to non-volatile memory devices, and more particularly, to a multi-level non-volatile memory device where each memory cell is capable of storing a plurality of bits.

BACKGROUND OF THE INVENTION

A read operation of information stored in a multi-level non-volatile memory cell is commonly carried out by applying a voltage ramp to the control gate for establishing the level at which the programmed multi-level cell enters a conduction state.

The voltage ramp applied to the control gate of an addressed array cell needs to be replicated with high precision on a reference cell. Naturally, substantially identical voltage ramps are respectively applied to the array wordline to which the addressed cell belongs, and to the wordline of a row of reference cells.

In the design of a multi-level FLASH memory device with voltage ramp reading, there is often a requirement to reduce in size the driver of the wordlines (WL) that is generally integrated adjacent to the array of memory cells.

Reading techniques based on applying a voltage ramp to the control gates of the cells require a close match between the voltage ramp that is applied on the reference wordline WLref and the voltage ramp that is applied on the array wordline WLarray, or at least a fair repeatability at all the operative corners. To this end, it is important to provide very good electrical connections of the wordline WL to be read, and of the wordline WL of the array of reference cells to the charge current source.

FIG. 1 shows a typical multi-sector partition of a non-volatile memory device. It also illustrates, in addition to the location of relevant components, the electrical parameters (capacitances) that play a fundamental role in generation of the read voltage ramp on the selected array wordline and reference wordline. The ramp generator Ramp Gen supplies a whole partition that will present a capacitive load composed of WLref+WLarray+Metal.

Referring now to FIG. 2, a comparison is made, only by way of example, of two possible architectures. In the architecture shown on the left side, the ramp generator RampGen sees a parasitic capacitance of the connection line Metal. This value is comparable to that of the two wordlines to be charged, WL array and WLref. In a situation such as that shown on the left side, it is accepted as a tolerable loss of charge the charging of the parasitic capacitance of the connection metal line.

In the architecture shown on the right side, where the banks of sense amplifiers are not replicated for the single partitions but are formed at one end of the array to serve all sectors, the bitlines (BL) tend to be particularly long by extending themselves through the whole array or partition thereof. As a consequence, the row decoding circuit Row-Dec that borders one side of the array is relatively long. In these devices, the parasitic capacitance of the connection line Metal may become larger than the capacitance of the two wordlines to be charged during a read phase.

Wasting such a large percentage of current for generating the read voltage ramp on the two selected wordlines WLarray and WLref is very penalizing. A relevant portion of the current absorbed for a read operation is wasted for charging the parasitic capacitance of the long metal line. The current for generating the read voltage ramp is generated from voltage boosted nodes, and thus, it is proportionally relevant on the total power dissipation and on the area of integration of the device.

SUMMARY OF THE INVENTION

An object of the invention is to find a cost effective approach that in general would eliminate or greatly reduce the current consumption for charging the parasitic capacitance of connection metal lines of the selected wordlines. This objective applies even in the case of an array architecture that includes relatively long connection metal lines (for instance, in the case of an architecture as that shown on the right side in FIG. 1).

The architecture in accordance with the invention attains fully the objective of practically nullifying the additional load represented by the parasitic capacitance of the metal line for connecting the selected wordlines to the current source. This ensures at the same time an enhanced matching between the voltage ramp generated on the selected array wordline WLarray and the voltage ramp generated on the reference wordline WLref.

This architecture comprises a local voltage ramp generator for each addressable sector of the array of memory cells, and for each array or sector of reference cells of the array or partition thereof. Each local ramp generator comprises a switch for starting a ramp and is supplied with the current generated by a high precision current generator.

Preferably, the current delivered by the unique or master current generator is adjusted by the user. The currents that are delivered to the local ramp generator of the selected memory sector for a read operation, and to the local ramp generator of the relative array or sector of reference cells, may be made practically identical to each other during EWS testing of the devices being fabricated according to common trimming techniques.

The architecture substantially eliminates any waste of current, typically generated by charge pump circuits at a boosted voltage for developing the required voltage ramp on the circuit nodes of the two selected wordlines for a read operation.

BRIEF DESCRIPTION OF THE DRAWINGS

The invention will be described referring to the attached drawings, wherein.

DETAILED DESCRIPTION OF THE PREFERRED EMBODIMENTS

Figure 1:
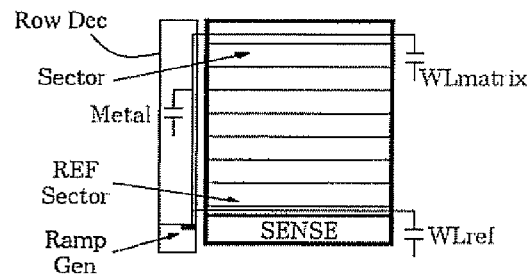
FIG. 1 shows the organization and the relative electrical parameters of a common architecture of a memory device in accordance with the prior art.
Figure 2:
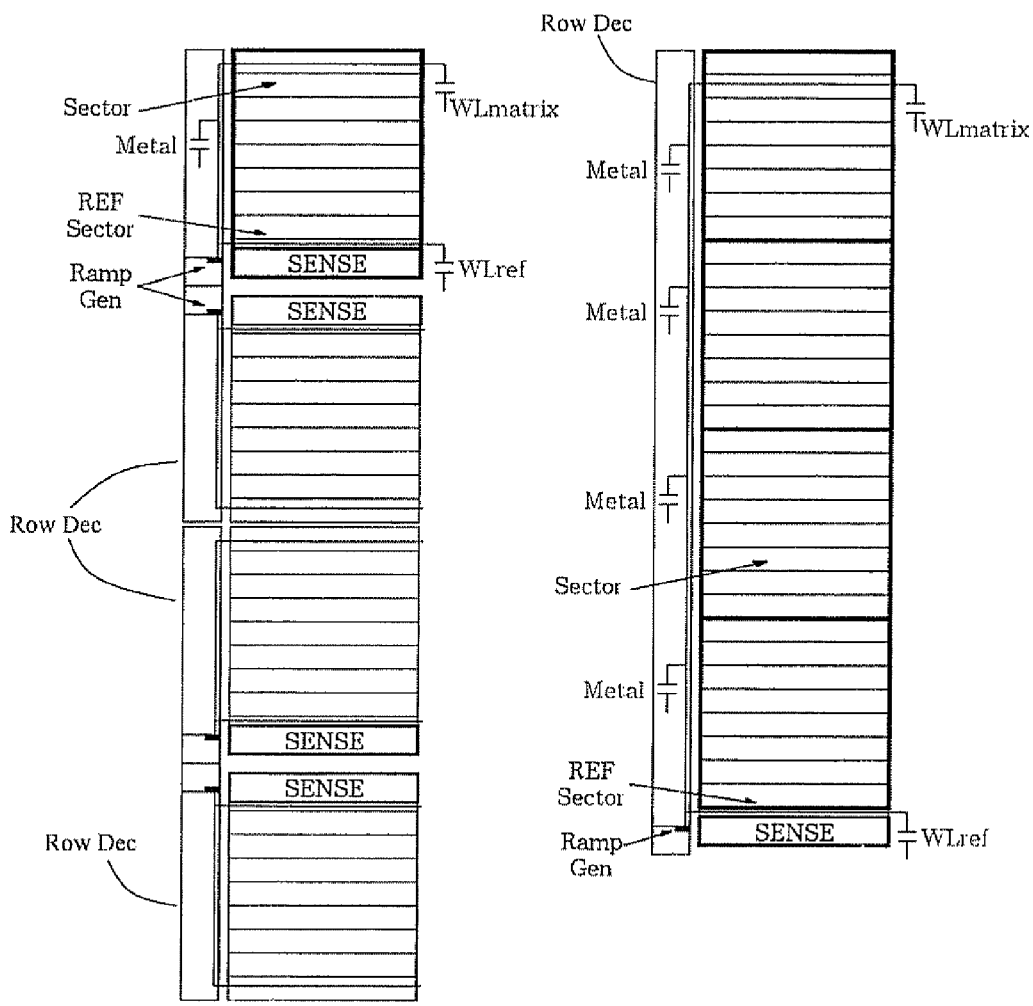
FIG. 2 compares two different architectures of a memory device in accordance with the prior art.
Figure 3:
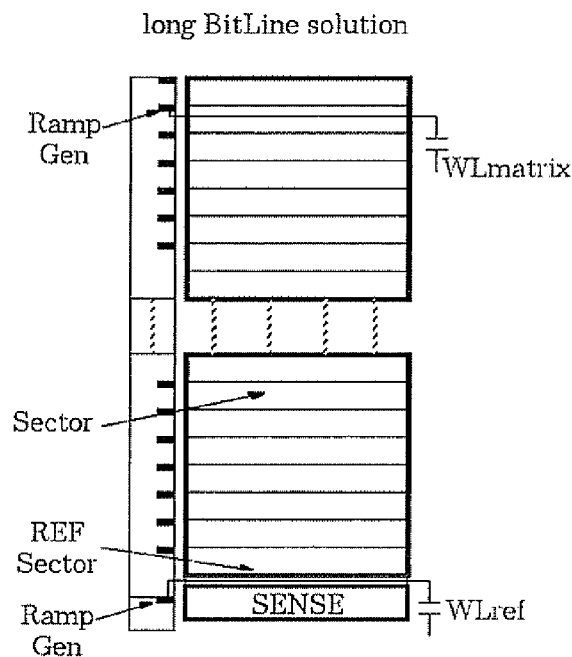
FIG. 3 is a basic illustration of the architecture in accordance with the invention.

Referring to FIG. 3, the architecture in accordance with the invention is characterized by the presence of a local ramp generator RampGen adjacent to each sector of the array or partition of memory cells, and adjacent to an array of reference cells RefSector associated with the bank of read amplifiers SENSE.

Figure 4:
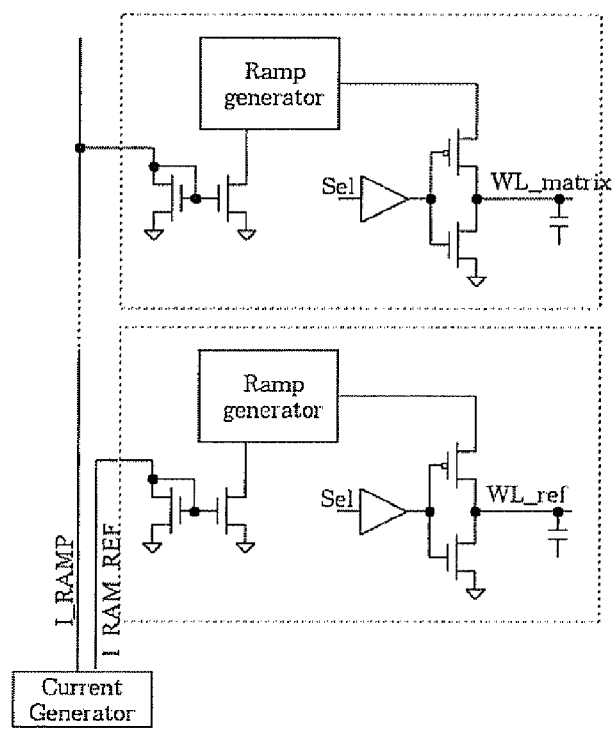
FIG. 4 shows a circuit embodiment of the architecture in accordance with the invention.

The circuit for charge current distribution to the local ramp generators according to the architecture of the invention is shown in FIG. 4. As may be easily observed, by virtue of the presence of a local ramp generator RampGen for each addressable sector, the use of a pass-gate for injecting current in a certain wordline WLmatrix, WLref is not required as in the prior art architectures.

The forcing of a charge current of the capacitance of the selected wordline for generating the required voltage ramp is not actuated through the circuit for decoding and selecting the wordline. On the contrary, it is carried out by the selected ramp generator of the addressed sector.

By neglecting local parasitic capacitances compared to the much larger capacitance of a wordline to be charged, the architecture practically eliminates current wasting and mismatch problems that affect the known architectures.

In FIG. 4, the current generator supplies all the local ramp generators RampGen located along side the respective sectors of the memory array, including the associated array of reference cells. The circuit includes a local current mirror in which the current supplied by the current generator is injected.

The current receiving mirror that uses for example, a MOS diode as an input device, does not introduce any significant mismatch because it is possible to realize both the MOS diode as well as the corresponding output MOS transistor of the current mirror physically close to each other. Moreover, the short distance that is implicit in sharing a common source region by the two devices that compose the current mirror minimizes also any mismatch imputable to different resistive voltage drops towards the ground node.

The driver stage of the wordline may be a single PMOS transistor instead of requiring a pass-gate as in common architectures, and thus it implies a significant reduction of silicon area requirements.

Figure 5:
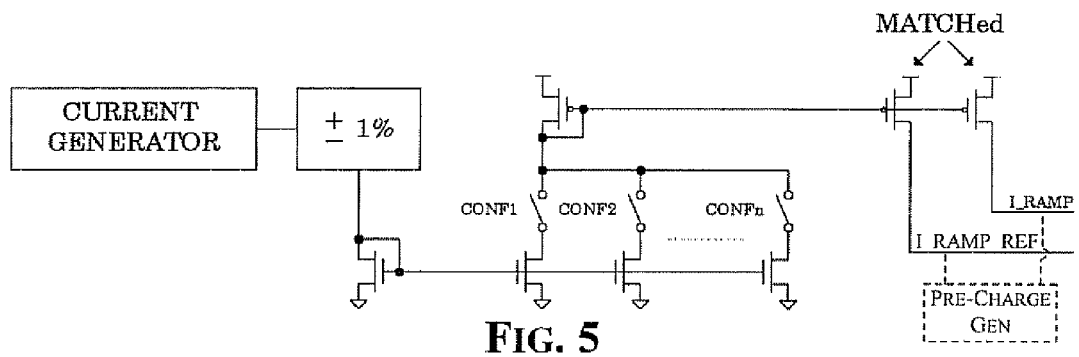
FIG. 5 shows a high precision master current generator in accordance with the invention.

FIG. 5 shows a sample circuit embodiment of the high precision current generator of the architecture of FIG. 4. The current generator may be a common high precision current generator operating at a boosted voltage referenced to the supply voltage of the memory device. Preferably, as shown in the example of FIG. 5, the current generator includes a circuit for adjusting the delivered output current, composed of a first NMOS current mirror. The output device of which may be operated during a trimming phase by closing or opening the configuration switches: Conf1, Conf2, . . . , ConfN for connecting in the circuit one or more of the distinct output transistors of the first current mirror.

A perfect matching of the current delivered towards the local ramp generators and towards the ramp generator of the reference cells may be ensured by eventually correcting the matching between two distinct common output transistors of the second PMOS current mirror. The two common output PMOS transistors of the second mirror, for delivering the generated current respectively toward the local ramp generator of the addressed sector of the array or array partition and toward the ramp generator of the array of reference cells, are preferably trimmed during the EWS phase of the devices being fabricated. This is for adjusting the geometry of one or the other of the two output devices, PMOS Matched, so as to make identical the two delivered currents I_Ramp and I_Ramp_Ref.

Alternatively, it is even possible to use an auxiliary current generator, preferably not a high precision generator, for pre-charging the two nodes I_Ramp and I_Ramp_Ref that are brought to the common ground potential (discharged) after each read operation, up to a pre-established potential, close to but smaller than a certain potential at which the read voltage ramp starts. This may be useful when the two nodes have a relevant capacitance for significantly reducing the required current and allowing use of an existing design of a high precision generator without adapting it (dimensioning it) for a relatively augmented capacitive load.

This possible alternative is schematically represented by the block Pre-ChargeGen and relative connections to the two nodes I_Ramp and I_Ramp_Ref, traced with broken lines, for highlighting that this modified circuit approach is an optional alternative.

Figure 6:
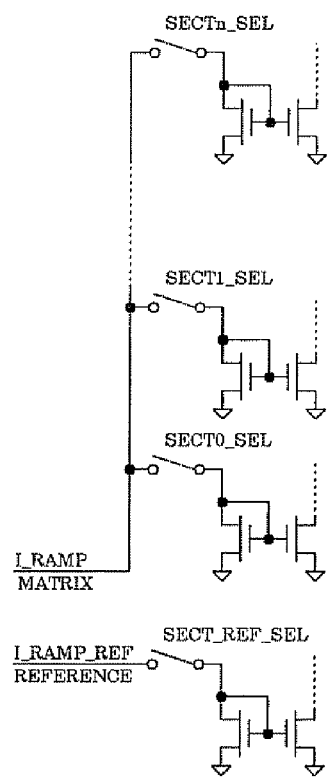
FIG. 6 is a detailed view of the circuit for distributing current to the selected local ramp generators in accordance with the invention.

FIG. 6 is a detailed circuit for the distribution of the current delivered by the current generator to the ramp generator of the addressed sector for reading data.

The detailed scheme of FIG. 6 shows the switch SECTi-SEL that ensures that the current injected on the node I_Ramp by the generator is fed to the single diode NMOS of the input branch of the local mirror of the addressed sector that receives the wordline charge current. The switch is controlled by the selection command of the sector of the array or partition of memory cells addressed for reading data therefrom.

Figure 7:
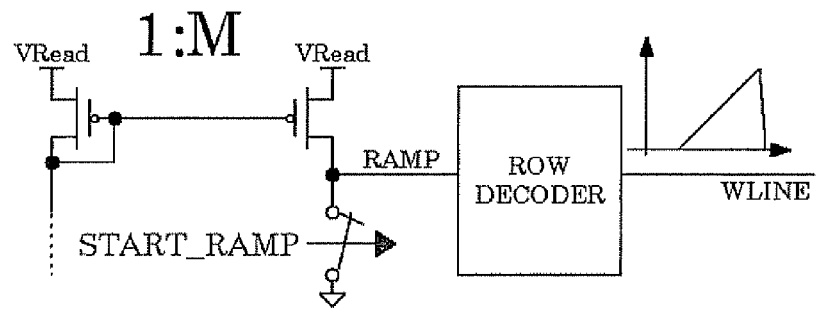
FIG. 7 is a sample functional scheme of the local ramp generator in accordance with the invention.

FIG. 7 shows a suitable circuit diagram of the local ramp generator. According to this sample embodiment, the local ramp generator comprises a current mirror circuit (PMOS, in the depicted example), but may also be formed by a combination of current mirrors appropriate for injecting a current. This current is eventually multiplied or de-multiplied with respect to the current injected in the node I_Ramp (I_Ramp_Ref) from the generator, on the wordline addressed for the read operation on which the voltage ramp must evolve.

As indicated above, the ramp generator includes a switch Start_Ramp for starting the ramp. The switch normally keeps the output voltage of the ramp generator at the common ground potential (0V) until the command for starting the ramp that closes the switch is received.

The use of a local ramp generator capable of injecting in the selected wordline a certain current, makes within certain limits, almost irrelevant the structure of the row decoding circuit ROW DECODER provided that the decoding path remains sufficiently conductive during the whole evolution of the decoding ramp on the addressed wordline.

A further advantage of the architecture of the invention is that of allowing the use of a much simpler row decoding circuit than that required in known architectures. By way of example, FIG. 8 shows a possible embodiment of the row decoder.

Because of the peculiar architecture of the invention, a circuit for driving a row composed of a single PMOS transistor (and relative NMOS transistor for grounding the electric charge injected on the selected wordline at the end of the read phase) is sufficient to generate a correct voltage ramp on the selected wordline. The sole requirement includes ensuring that the parasitic capacitances along the decoding path be a negligible fraction of the wordline capacitances. That is, that the following condition be verified:

$$CWL \gg CP1\_CP0.$$

Figure 8:
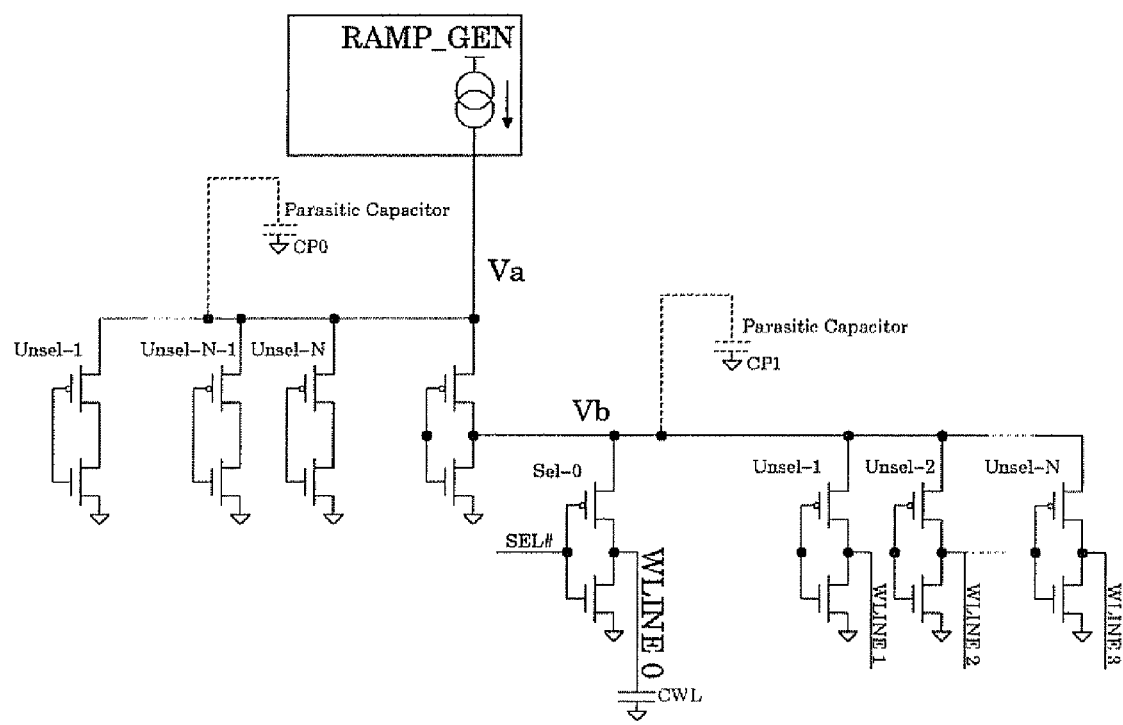
FIG. 8 shows a simplified sample embodiment of the row decoding circuit in accordance with the invention.
Figure 9:
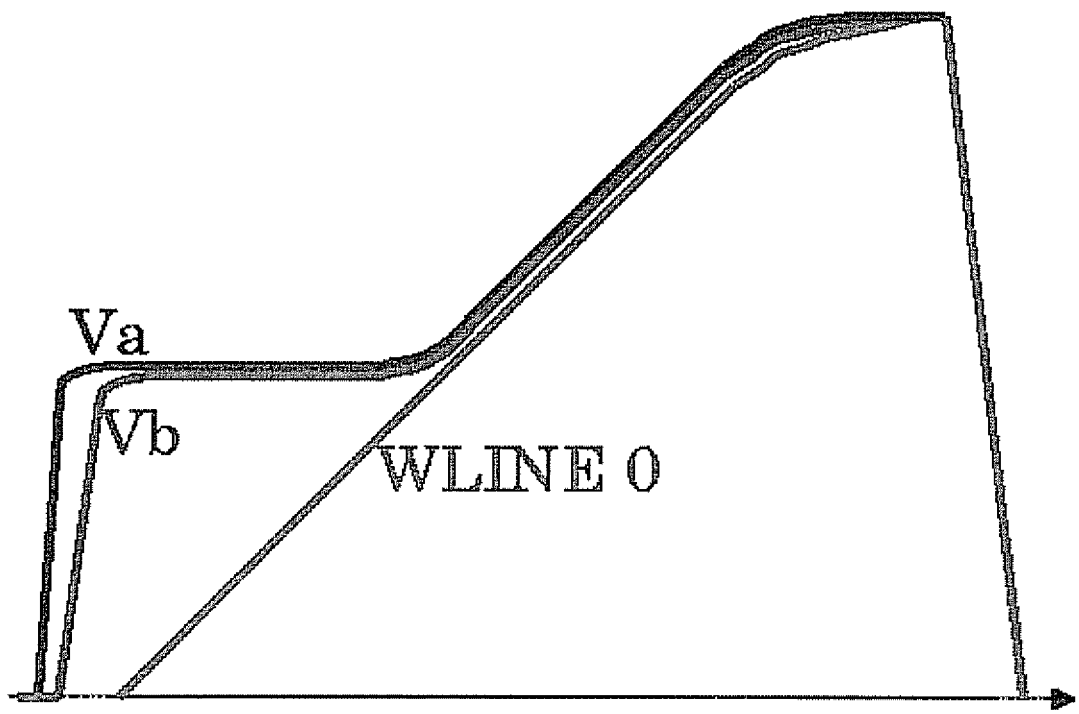
FIG. 9 shows voltage waveforms on circuit nodes for the circuit shown in FIG. 8.

FIG. 9 shows waveforms of the voltages of the respective circuit nodes of FIG. 8. Substantially, the voltage on the selected wordline WLINE0 is a linear ramp, while the intermediate nodes Va and Vb of the row decoder assume voltage values necessary to connect the selected wordline to the output of the local ramp generator RampGen.

This condition makes substantially insignificant eventual mismatches that may exists between the transistors that compose the row decoder. The architecture of the invention efficiently exploits the current generated for charging the selected wordlines during the read phase, thus increasing the efficiency in terms of power consumption of the memory device during read phases.

A further advantage is the reduction of the area requirement of the row decoding circuits because of the fact that it is possible to use only PMOS transistors instead of passgates (composed of NMOS and PMOS pairs) for driving the selected wordlines. This novel architecture is particularly effective for reading memory devices storing a plurality of bits in each cell (multi-level memory), but it may be used also in single level memory devices.

That which is claimed is:

1. A non-volatile memory device comprising:
   an array of memory cells organized into a plurality of array sectors, each array sector singularly addressable through an array wordline;
   at least one array of reference cells addressable through a reference wordline;
   a respective voltage ramp generator for each array sector for generating a voltage ramp on an array wordline for reading a memory cell therein, and for each array of reference cells for generating a voltage ramp on a reference wordline for a reference cell therein;
   a respective row decoding circuit coupled between each respective voltage ramp generator and corresponding reference wordline or array wordline; and
   a current generator for generating a current to be injected on a circuit node in a selected array sector and on a circuit node of said at least one array of reference cells to produce on the circuit nodes a voltage ramp similar to the generated voltage ramp; and
   a respective local ramp generating circuit for each array sector and for said at least one array of reference cells, and comprising a switch controlled by a ramp starting signal for delivering a charge current based upon a capacitance of the circuit nodes of the corresponding addressed array wordline or reference wordline, towards the respective row decoder of the wordline.

2. A nonvolatile memory device according to claim 1, wherein each local ramp generating circuit comprises a current mirror having an output node connected to an input node of a respective row decoding circuit and to said switch; and wherein said switch keeps said local ramp generating circuit at a common ground potential of the memory until a pulse having a preestablished duration for starting a voltage ramp is received.

3. A nonvolatile memory device according to claim 1, wherein each local ramp generating circuit comprises a current mirror, and a selection switch connected to said current mirror, each selection switch being connected to a distribution line; and wherein said current generator is configured as a high precision current generator that supplies the current through said distribution line to each local ramp generating circuit via said corresponding selection switch.

4. A non-volatile memory device according to claim 3, wherein said high precision current generator comprises a matched pair of output transistors coupled to another transistor for forming a current mirror, and wherein the current generated by said high precision current generator is provided through said matched pair of output transistors of said current mirror, with dimensions of said matched pair of output transistors being trimmed for delivering identical currents to the array wordline and reference wordline.

5. A non-volatile memory device according to claim 4, wherein each row decoder provides for a charge current path for the capacitance of the selected array wordline that includes a single MOS transistor.

6. A non-volatile memory device according to claim 3, further comprising an auxiliary precharge current generator for pre-charging the capacitances of the circuit nodes coinciding with said distribution lines of the current precisely established on said local ramp generators of the selected array sector and towards the array of reference cells up to a voltage close to but less than a pre-established value for starting the voltage ramp.

7. A memory device comprising:
   an array of memory cells organized into a plurality of array sectors, each array sector singularly addressable through an array wordline;
   at least one array of reference cells addressable through a reference wordline;
   a respective voltage ramp generator for each array sector for generating a voltage ramp on an array wordline for reading a memory cell therein, and for each array of reference cells for generating a voltage ramp on a reference wordline for a reference cell therein;
   a respective row decoding circuit coupled between each respective voltage ramp generator and corresponding reference wordline or array wordline;
   a current generator for generating a current to be injected on a circuit node in a selected array sector and on a circuit node of said at least one array of reference cells to produce on the circuit nodes a voltage ramp similar to the generated voltage ramp; and
   a respective local ramp generating circuit for each array sector and for said at least one array of reference cells, and delivering a charge current based upon a capacitance of the circuit nodes of the corresponding addressed array wordline or reference wordline, towards the respective row decoder of the wordline.

8. A non-volatile memory device according to claim 7, wherein each respective local ramp generating circuit comprises a switch controlled by a ramp starting signal for delivering the charge current.

9. A nonvolatile memory device according to claim 8, wherein each local ramp generating circuit comprises a current mirror having an output node connected to an input node of a respective row decoding circuit and to said switch; and wherein said switch keeps said local ramp generating circuit at a common ground potential of the memory until a pulse having a preestablished duration for starting a voltage ramp is received.

10. A non-volatile memory device according to claim 9, wherein each local ramp generating circuit comprises a current mirror, and a selection switch connected to said current mirror, each selection switch being connected to a distribution line; and wherein said current generator is configured as a high precision current generator that supplies the current through said distribution line to each local ramp generating circuit via said corresponding selection switch.

11. A non-volatile memory device according to claim 10, wherein said high precision current generator comprises a matched pair of output transistors coupled to another transistor for forming a current mirror, and wherein the current generated by said high precision current generator is provided through said matched pair of output transistors of said current mirror, with dimensions of said matched pair of output transistors being trimmed for delivering identical currents to the array wordline and reference wordline.

12. A non-volatile memory device according to claim 7, wherein each row decoder provides for a charge current path for the capacitance of the selected array wordline that includes a single MOS transistor.

13. A nonvolatile memory device according to claim 9, further comprising an auxiliary precharge current generator for pre-charging the capacitances of the circuit nodes coinciding with said distribution lines of the current precisely established on said local ramp generators of the selected array sector and towards the array of reference cells up to a voltage close to but less than a pre-established value for starting the voltage ramp.

14. A method for reading a non-volatile memory device comprising an array of memory cells organized into a plurality of array sectors, each array sector singularly addressable through an array wordline; and at least one array of reference cells addressable through a reference wordline, the method comprising:
  using a respective voltage ramp generator for each array sector for generating a voltage ramp on an array wordline for reading a memory cell therein, and for each array of reference cells for generating a voltage ramp on a reference wordline for a reference cell therein;
  using a respective row decoding circuit coupled between each respective voltage ramp generator and corresponding reference wordline or array wordline for selecting a memory cell and corresponding reference cell;
  generating a current to be injected on a circuit node in a selected array sector and on a circuit node of the at least one array of reference cells to produce on the circuit nodes a voltage ramp similar to the generated voltage ramp; and
  using a respective local ramp generating circuit for each array sector and for the at least one array of reference cells, and delivering a charge current based upon a capacitance of the circuit nodes of the corresponding addressed array wordline or reference wordline, towards the respective row decoder of the wordline.

15. A method according to claim 14, wherein each respective local ramp generating circuit comprises a switch controlled by a ramp starting signal for delivering the charge current.

16. A method according to claim 15, wherein each local ramp generating circuit comprises a current mirror having an output node connected to an input node of a respective row decoding circuit and to the switch; and wherein the switch keeps the local ramp generating circuit at a common ground potential of the memory until a pulse having a pre-established duration for starting a voltage ramp is received.

17. A method according to claim 16, wherein each local ramp generating circuit comprises a current mirror, and a selection switch connected to the current, each selection switch being connected to a distribution line; and wherein the current generator is configured as a high precision current generator that supplies the current through the distribution line to each local ramp generating circuit via the corresponding selection switch.

18. A method according to claim 17, wherein the high precision current generator comprises a matched pair of output transistors coupled to another transistor for forming a current mirror, and wherein the current generated by the high precision current generator is provided through the matched pair of output transistors of the current mirror, with dimensions of the matched pair of output transistors being trimmed for delivering identical currents to the array wordline and reference wordline.

19. A method according to claim 14, wherein each row decoder provides for a charge current path for the capacitance of the selected array wordline that includes a single MOS transistor.

20. A method according to claim 17, further comprising an auxiliary precharge current generator for pre-charging the capacitances of the circuit nodes coinciding with the distribution lines of the current precisely established on the local ramp generators of the selected array sector and towards the array of reference cells up to a voltage close to but less than a preestablished value for starting the voltage ramp.

* * * * *

UNITED STATES PATENT AND TRADEMARK OFFICE
CERTIFICATE OF CORRECTION

PATENT NO. : 7,321,512 B2
APPLICATION NO. : 11/381426
DATED : January 22, 2008
INVENTOR(S) : Vimercate et al.

It is certified that error appears in the above-identified patent and that said Letters Patent is hereby corrected as shown below:

Column 3, Line 30  Delete: "along side"
Insert: -- alongside. --

Column 5, Line 13  Delete: "exists"
Insert: -- exist --

Column 5, Line 54  Delete: "nonvolatile"
Insert: -- non-volatile --

Column 5, Line 60  Delete: "preestablished"
Insert: -- pre-established --

Column 5, Line 62  Delete: "nonvolatile"
Insert: -- non-volatile --

Column 6, Line 17  Delete: "precharge"
Insert: -- pre-charge --

Column 6, Line 54  Delete: "nonvolatile"
Insert: -- non-volatile --

Column 6, Line 60  Delete "preestablished"
Insert: -- pre-established --

Column 7, Line 16  Delete: "nonvolatile"
Insert: -- non-volatile --

Column 7, Line 17  Delete: "precharge"
Insert: -- pre-charge --

Column 8, Line 40  Delete: "precharge"
Insert: -- pre-charge --

UNITED STATES PATENT AND TRADEMARK OFFICE
CERTIFICATE OF CORRECTION

PATENT NO. : 7,321,512 B2
APPLICATION NO. : 11/381426
DATED : January 22, 2008
INVENTOR(S) : Vimercate et al.

It is certified that error appears in the above-identified patent and that said Letters Patent is hereby corrected as shown below:

Column 8, Line 45  Delete: "preestablished"
Insert: -- pre-established --

Signed and Sealed this

Second Day of September, 2008

JON W. DUDAS
*Director of the United States Patent and Trademark Office*